(12) United States Patent
Detlefsen

(10) Patent No.: US 6,894,588 B2
(45) Date of Patent: May 17, 2005

(54) RESONATOR FILTER WITH IMPROVED ADJACENT CHANNEL SELECTIVITY

(75) Inventor: Andreas Detlefsen, Munich (DE)

(73) Assignee: EPCOS AG, München (DE)

( * ) Notice: Subject to any disclaimer, the term of this patent is extended or adjusted under 35 U.S.C. 154(b) by 32 days.

(21) Appl. No.: 10/366,873

(22) Filed: Feb. 14, 2003

(65) Prior Publication Data

US 2003/0231083 A1 Dec. 18, 2003

(30) Foreign Application Priority Data

Feb. 15, 2002 (DE) .......................... 102 06 376

(51) Int. Cl.[7] .............................. H03H 9/64
(52) U.S. Cl. ................ 333/195; 333/196; 310/313 D
(58) Field of Search ............................. 333/193–196; 310/313 B, 313 D

(56) References Cited

U.S. PATENT DOCUMENTS 5,760,664 A * 6/1998 Allen .......................... 333/194
5,831,494 A * 11/1998 Solie .......................... 333/193
6,140,890 A * 10/2000 Sakairi ........................ 333/195
6,420,946 B1  7/2002 Bauer et al. ................ 333/193
6,650,207 B1 * 11/2003 Tanaka ....................... 333/195

FOREIGN PATENT DOCUMENTS

| DE | 198 49 782 |   | 9/2000 |
| JP | 2-172312 | * | 7/1990 |
| JP | 9-116372 | * | 5/1997 |
| JP | 11-163675 | * | 6/1999 |
| JP | 11-317643 | * | 11/1999 |
| JP | 2001-332954 | * | 11/2001 |
| JP | 2003-188674 | * | 7/2003 |

\* cited by examiner

Primary Examiner—Barbara Summons
(74) Attorney, Agent, or Firm—Schiff Hardin LLP

(57) ABSTRACT

For improving the adjacent channel selectivity of a resonator filter, reflectors of resonators are differently designed so that the minimums of the reflection functions of different reflectors of a resonator are shifted relative to one another and preferably compensate with the corresponding maximum of the respectively other reflection function. This reduces noise spikes at the low-frequency side of the pass-band of corresponding resonator filters and, thus, improves the adjacent channel selectivity.

27 Claims, 6 Drawing Sheets

Fig 8
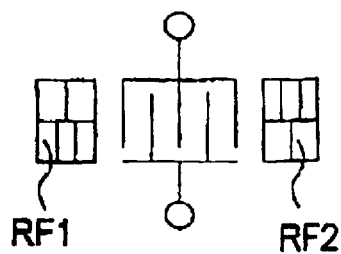
Fig 9        PRIOR ART
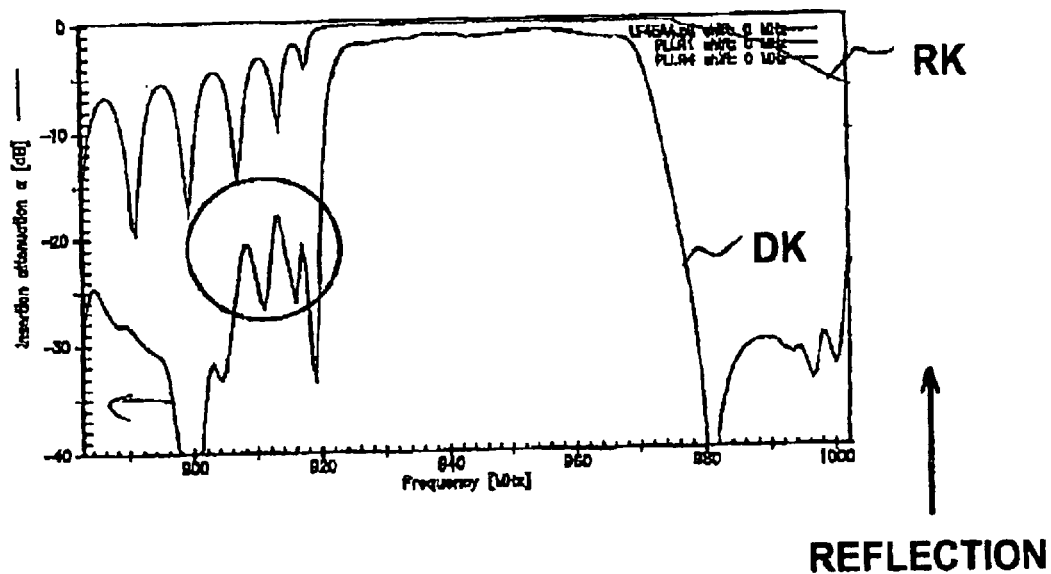
REFLECTION

RESONATOR FILTER WITH IMPROVED ADJACENT CHANNEL SELECTIVITY

BACKGROUND OF THE INVENTION

1. Field of the Invention

The invention relates to resonant filters for improving adjacent channel selectivity.

2. Description of the Related Art

Spikes with slight attenuation behavior that negatively influence the adjacent channel selectivity in a particular frequency range are usually found at the left side of the pass-band in the transfer function of Dual Mode Surface acoustic wave SAW (DMS) filters. When, for example, such a filter is utilized as an input filter in the front end of a mobile radiotelephone device, then the disturbing spikes in the transfer function lie in the region of the transmit ("TX") band that is provided for the incoming signals. The TX suppression is unacceptably slight due to the spikes in the TX region, particularly given single-track DMS filters, so that the filter cannot be utilized as a TX filter.

For solving this problem, DMS filters with a plurality of cascaded tracks were previously utilized, where these tracks are differently designed in terms of one or more parameters. In particular, DMS filters are utilized in which two filter tracks are cascaded whose finger periods of the inter-digital transducers are differently selected. It is also possible that the tracks of cascaded DMS filters differ in terms of other parameters, this allowing the spikes at the left side of the pass-band to be successfully reduced. The desired effect, however, is not adequate and, in particular, a satisfactory possibility of eliminating these disturbing spikes has not yet been found for one-track DMS filters.

SUMMARY OF THE INVENTION

It is therefore an object of the present invention to provide a resonator filter that exhibits an improved adjacent channel selectivity and in which, in particular, disturbing spikes at the low-frequency side of the pass-band are eliminated in the near stop-band.

This object is inventively achieved by a resonator filter for acoustic surface waves or surface-proximate waves, comprising: a whole positive number n of acoustic resonators fashioned on a piezoelectric substrate, each respectively comprising at least one interdigital transducer; a first and a second reflector between which the at least one interdigital transducer is arranged, the reflectors being respectively allocated to at least one of the n resonators and that respectively are constructed to exhibit a frequency-dependent reflection behavior and to provide a reflection function comprising at least one minimum; wherein the first and the second reflector are fashioned differently so that the frequency position of the minimums of the two reflection functions of the first and second reflector are shifted relative to one another.

Inventive developments include providing the resonator filter with a first acoustic track and a second acoustic track, a first acoustic resonator being provided in the first acoustic track, and a second acoustic resonator being provided in the second acoustic track, the first resonator and the second resonator being connected to one another; the first and second reflectors being arranged in a same track. The resonator filter may be fashioned as a single-track or multi-track dual-mode SAW (DMS) filter. The resonator filter may provide that the minimums of the reflection functions of the first and second reflector are shifted relative to one another such that a minimum of the first reflection function has approximately the same frequency position as a maximum of the second reflection function. The resonator filter may comprise a plurality of n resonators having respectively two reflectors are present; and one to n resonators may respectively comprise two reflectors that exhibit reflection functions that are different and shifted relative to one another, the minimums of the at least two reflection functions of the at least one resonator or the 2n reflection functions of the n resonators are shifted relative to one another and are thus not congruent. The resonator filter may further comprise a different plurality of reflector stripes in the first and second reflector configured such that a shift of minimums of the first and second reflector is achieved. Center reflector strips of the first and second reflector may be provided, the center reflector strips configured such that a shift of minimums of the first and second reflector is achieved by a different spacing of the centers reflector strips. At least one of the reflectors may have reflector stripes and be divided into two or more segments that differ on the basis of at least one of a plurality and spacing of centers of the reflector stripes. The segments of the at least one reflector may be arranged parallel to one another and thus respectively form a sub-aperture of the resonator, the sum of the sub-aperture widths allocated to the segments corresponding to at least an overall aperture of the resonator. The segments may be arranged following one another in a wave propagation direction. A spacing of respectively two neighboring centers of reflector strips can vary over a length of the reflectors measured in a wave propagation direction. Also, a width of reflector strips may vary over a length of the reflectors measured in a wave propagation direction. Specific values for the spacing of two neighboring reflector strip centers can follow corresponding function values of a periodically sampled, steady function viewed over the length of the resonators. Specific values for the width of reflector strips can follow corresponding function values of a periodically sampled, steady function viewed over the length of the resonators. Specific values for at least one of a width of individual electrode fingers of the interdigital transducers and a spacing of two neighboring electrode fingers can follow corresponding function values of a periodically sampled, steady function viewed over a length of the resonators. At least one of a width of individual and a center-to-center spacing of two neighboring electrode fingers of at least one of the interdigital transducers and reflector stripes can vary continuously transverse to a length of the resonator composed of interdigital transducers and reflectors. The quantities of width and center-to-center spacing transverse to the length may be fashioned in a linearly increasing manner. When comprising one-port resonators, an interdigital transducer may be arranged at each one-port resonator between a first and a second reflector, and frequency positions of the minimums of the reflection functions of the first and second reflector may be shifted relative to one another at at least one resonator. Finally, specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements may follow corresponding function values of a steady function in the region of the transition as viewed over a length of the resonator, thereby avoiding discontinuities and hard transitions between neighboring resonator structure elements. These aspects are explained in more detail below.

The inventors have recognized that the disturbing spikes at the left side of the pass-band can be influenced by the design of the reflectors. It has been shown that the frequency-dependent reflection of reflectors comprises pole locations that form minimums in the reflection function. These minimums in turn lead to spikes with lower attenuation in the transfer function of resonator filters that have such reflectors.

The invention exploits this formation of pole locations in that two reflectors are provided within a resonator that are so differently fashioned that the frequency positions of the minimums of the two reflection functions are shifted relative to one another. This results in the pole locations exhibited by the reflectors within the resonator filter mutually compensating at least partially, by which a transfer function is obtained in which the disturbing spikes are clearly reduced. An inventive resonator filter with the improved reflectors exhibits an improved adjacent channel selectivity. With this simple measure and without further optimization of the overall filter, the near range suppression of a single-track DMS filter can be increased from, for example, 18 dB to more than 22 dB.

Preferably, a first and a second reflector that are allocated to the same resonator are selected in an inventive resonator filter as reflectors to be matched relative to one another. Such a resonator is usually composed of at least one interdigital transducer that is limited at both sides by a respective reflector. A DMS filter can comprise three and more interdigital transducers that can be interconnected to one another in groups. A single-port resonator usually comprises only one interdigital transducer. In the simplest case, a reflector for a resonator is composed of a pattern of stripes arranged at regular intervals, particularly a metallic stripe pattern. It can be composed of "floating stripes" that are not connected to one another or it can comprise at least partially shorted reflector stripes.

However, it is also possible to compensate, i.e., shift minimums of the reflection function relative to one another, at first and second reflectors that are situated in different tracks, i.e., are allocated to different reflectors of the same resonator filter.

In a preferred embodiment of the invention, the shift of the minimums in the reflection function of a first and of a second reflectors ensues such that a minimum of the reflection of the first reflector exactly corresponds to a maximum of the second reflector, so that the minimums are compensated by the maximums. In this way, an optimum compensation and a maximum improvement of the adjacent channel selectivity or a maximum suppression of the noise spikes are achieved.

The invention can be applied both in DMS filters as well as in single-port resonators and resonator filters constructed of such single-port resonators, particularly in filters constructed in branching technique, for example, given ladder-type filters. When the two reflectors are selected so differently within a resonator that their minimums of the reflection function are shifted relative to one another and are optimally compensated by a maximum of the reflection function, then an improved filter behavior and, in particular, a improved adjacent channel selectivity are also obtained for single-port resonators and, thus, for resonator filters constructed of single-port resonators.

When a filter comprises a plurality of resonators, then all reflectors of all resonators can be shifted such with respect to their reflection functions in a development of the invention that no two minimums are congruent.

Shifting the minimums of the reflection function of a reflector succeeds, for example, by modifying the plurality of reflector stripes. Although the spacing of the pole locations in the reflection function of the reflector varies as a direct result, this simultaneously results in the absolute position of the pole locations also shifting. This results in a reduction of the noise spikes that is observed in a resonator filter even given a slight difference in the plurality of reflector stripes between a first and a second reflector. For an optimum suppression of the noise spikes, the pole locations of the first and second reflector are shifted by half a pole position spacing, this being achieved in that the plurality of reflector stripes is modified by approximately five through 20 percent between first and second reflector.

Another possibility of modifying the position of the pole locations is to vary the "finger period", i.e., in the variation of the spacings of the middles of the reflector stripes. As a result of this variation, the overall reflection function is successfully shifted with respect to the center frequency. An increase in the reflector stripe spacings or in the spacings of the middles of the reflector stripes results in the center frequency of the reflection of a reflector being shifted toward lower frequencies. With this variation, one optimally succeeds in undertaking the shift by half a pole location spacing, where the minimums of the reflection function of the first reflector can be largely compensated by the corresponding maximums of the reflection function of the second reflector.

In a further development of the invention, it is also possible to apply both variation possibilities within a single resonator filter and to select both finger period as well as plurality of reflector stripes of a first and of a second reflector differently. The suppression of the noise spikes is further optimized as a result of this.

In another development of the invention, the compensation of pole locations of the reflection function of individual reflectors and, thus, the suppression of the noise spikes ensues by varying a single reflector. This can be achieved, for example, in that at least one reflector is divided into at least two segments that differ with respect to the center-to-center spacings of the reflector stripes and/or with respect to the plurality of reflector stripes. Such a division can ensue, for example, into segments that are arranged parallel to the propagation direction of the acoustic wave and next to one another. Each of these segments serves as reflector for a sub-aperture of the resonator, where the sub-apertures add up to form the overall aperture of the respective resonator. However, it is also possible that the apertures of the segments add up to form an overall aperture that is larger than the aperture of the resonator.

When the parameters of the individual segments of a reflector subdivided into segments are optimized in a suitable way, then the reflections of the two segments can mutually compensate with respect to their pole locations, so that an improved transfer behavior of the resonator filter and, in particular, an improved noise spike suppression of the resonator filter are also achieved given this embodiment of the invention. Preferably, all reflectors of all resonators of an inventive resonator filter are subdivided into segments in a corresponding way. This leads to at least four reflector segments per resonator whose minimums can all be offset relative to one another. By superimposing the reflection functions of these four reflector segments, an optimum smoothing of the reflection function or an optimum compensation of the pole locations of the reflector segments and, thus, an optimized noise spike suppression are achieved.

Alternatively, the reflectors of a resonator can be divided into segments such that these lie following one another in propagation direction of the acoustic wave. Given such a division into segments, however, these differ only with respect to the spacings of the middles of the reflector stripes. Preferably, however, the reflectors are divided into segments that are parallel to one another and cover sub-apertures.

Usually, resonator filters employ resonators whose structure elements such as interdigital transducers and reflectors respectively comprise uniform parameters in and of themselves with respect to width of electrode fingers or reflector stripes and center-to-center spacing of reflector stripes or electrode fingers. However, it is also possible to vary one or more of these parameters within a resonator such over the length of the resonator or of the resonator structure element that the specific values of the varied parameter—as viewed over the length—correspond at a location x to the corresponding values of a steady function sampled at the location x. For example, the parameters can linearly increase or decrease. However, it is also possible to vary the parameters according to a function that, for example, comprises a minimum or a maximum in, for example, the middle of the respective structure element.

Such a variation can be undertaken in only one structure element or in all structure elements as well. For example, only the reflectors can thus be varied according to a function in terms of at least one parameter. Stripe widths, stripe spacings and center-to-center spacings of the stripes can be varied as parameters. A corresponding variation can also be undertaken in an interdigital transducer.

It is also possible to vary both resonator elements according to one or more functions.

A further variation of inventive resonator filters is comprised in that the characteristics of the resonator elements, particularly the center-to-center spacings of reflector stripes and/or electrode fingers and/or the widths of reflector stripes and/or reflector fingers, vary along an axis that is arranged transverse to the propagation direction of the acoustic wave. When such a variation according to a continuous function relates to an interdigital transducer, this is then also called a fan transducer. The variation function transverse to the propagation direction can be a linear function, so that the corresponding parameters vary linearly along this axis. It is also possible to implement this variation according to a hyperbola function.

A further possibility is comprised in implementing inventive resonators or inventively resonator filters constructed with curved resonator stripes and/or curved electrode fingers, in which focusing structures are obtained.

Regardless of whether uniform parameters are employed over the length of a resonator structure element, the parameters are varied in a further development of the invention in the region of the transition between two neighboring structure elements such that the corresponding function values follow a steady function in the region of the transition from one structure element to the neighboring structure element, so that a discontinuity or a hard transition from one structure element to the other is avoided with respect to the corresponding parameter. When, for example, two neighboring structure elements comprise a greater spacing than corresponds to the spacing of the middles of the fingers or the middles of the stripes in their finger/stripes residing at the end, then this enlarged spacing of the fingers or reflector stripes in the region of the transition can be adapted by appropriate variation of the center-to-center spacings of the electrode fingers or of the reflector stripes.

Such a matching can ensue such that a minimum arises in the region of the transition with respect to the parameter (for example, center-to-center spacing of the reflector stripes or electrode fingers). To that end, for example, two through six electrode fingers or reflector stripes residing at the end are varied with respect to their position. It can be necessary to insert an additional reflector stripe or an additional electrode finger in order to obtain the desired soft transition. Such an improved resonator is disclosed, for example, by German Patent Application DE 198 49 782 A.

The invention can be utilized in single-port resonators that respectively comprise only one interdigital transducer. The invention can also be utilized in DMS filters that usually comprise an odd-numbered plurality of interdigital transducers, for example 3, 5, 7 or more interdigital transducers. Interdigital transducers connected to the input side and the output side in this arrangement alternate. In cascaded DMS filters, the interdigital transducers of the first track allocated to the output side are connected to the interdigital transducers of the second track allocated to the input side. Further DMS tracks can be cascaded in the same way, by which the selection of the overall filter is improved.

Inventive resonators can be constructed on arbitrary substrates, particularly on the preferred crystalline substrates lithium tantalate and lithium niobate. It is also possible to realize inventive resonator filters on quartz, langasite or other filter materials, or even ceramic piezoelectric substrates.

The resonator structures, particularly the interdigital transducers and the reflector stripes can be realized as stripe-shaped metallizations, in which aluminum or aluminum alloys are usually employed. Adhesion promoter layers, for example a thin titanium layer, can be arranged between the aluminum-containing electrodes and the substrate for improving the adhesion of the metallization stripes.

It is also possible to implement the metallizations in a multi-layer manner in order to improve the power compatibility of the metallization. This is achieved with structures that are more able to withstand both the mechanical as well as the electrical and thermal stresses. For example, diffusion stop layers of copper can alternate with layers of aluminum or aluminum alloy. The acousto-migration is reduced in this way, this particularly occurring given aluminum-containing electrode structures under mechanical, electrical or mechanical stress. Furthermore, the electrode structures can be covered with passivation layers in order to prevent an efflorescence of structures caused by acousto-migration. A plurality of, in particular, electrically insulating materials that can be deposited in thin-film processes can be utilized for such passivation layers, particularly oxides and nitrides such as, for example, silicon oxide, titanium oxide, silicon nitride or silicon carbide.

DESCRIPTION OF THE DRAWINGS

The invention is explained in greater detail below on the basis of exemplary embodiments and the appertaining Figures.

FIGS. 5–8 are schematic diagrams showing different embodiments of the reflectors on the basis of a single-port resonator;

FIG. 9 is a graph showing the transfer function of a known single-track DMS filter compared to the reflection function of its reflectors;

The Figures show the invention in a schematic illustration that is not to scale. Identical parts are referenced with the same reference characters.

DETAILED DESCRIPTION OF THE INVENTION

Figure 1:
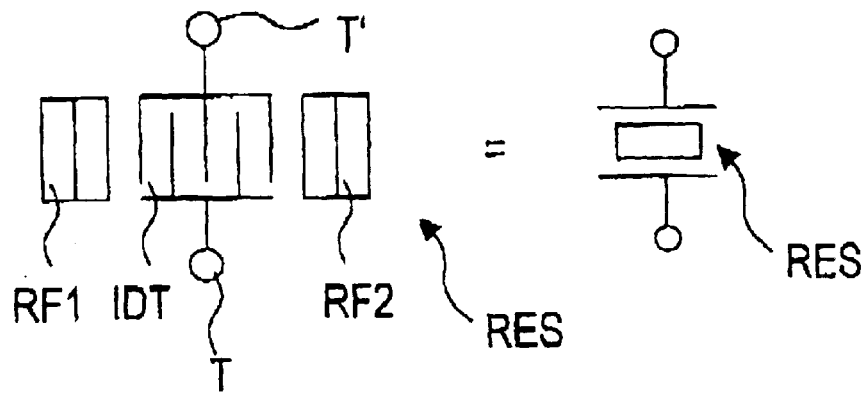
FIG. 1 is a schematic diagram showing an inventive single-port resonator.

FIG. 1 shows a single-port resonator that can be part of an inventive resonator filter. The left part of FIG. 1 indicates the metallization on the surface of a piezoelectric substrate, and the right part of the FIG. 1 indicates the circuit symbol employed for it.

A single-port resonator is composed of an interdigital transducer IDT that is in turn composed of two electrode combs that have their "teeth" inserted into one another. Each comb is connected to a respective terminal T, T'. A respective reflector RF1, RF2 is arranged at both sides of the interdigital transducer IDT. This is composed of what is usually a regular stripe pattern whose stripes—as indicated in FIG. 1—can be electrically shorted. Overall, the reflector can be connected to ground or can be without a connection to a reference potential. Given this simple resonator, the two reflectors RF1 and RF2 inventively differ in their reflection function such that the minimums of the reflection function lie at different frequencies or are shifted relative to one another.

Figure 2:
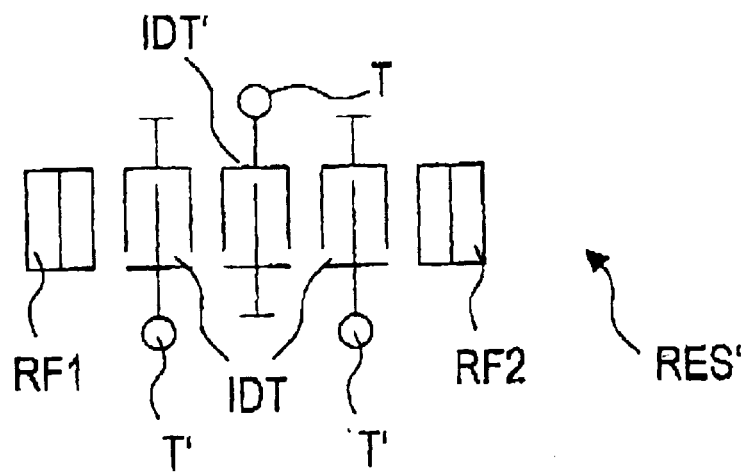
FIG. 2 is a schematic diagram showing an inventive single-track DMS filter.

The resonator according to FIG. 1 can only serve as an impedance element to which a resonant frequency and an anti-resonant frequency with maximum or minimum conductivity is allocated. FIG. 2, however, shows a complete resonator filter, a single-track DMS filter (dual mode SAW filter) in this case. Such a single-track DMS resonator filter is composed of a plurality of interdigital transducers IDT, IDT' that are connected in alternation to the input or output or to the corresponding terminals T and T'.

A respective reflector RF1, RF2 is arranged at each side of the interdigital transducers IDT. As a result of a corresponding selection of the spacings between the interdigital transducers and/or the reflectors, two longitudinal modes form at which resonance occurs. Inventively, the reflectors RF1 and RF2 also differ in this case with respect to their reflection function, so that the two reflection functions are shifted relative to one another with respect to their minimums.

Figure 3:
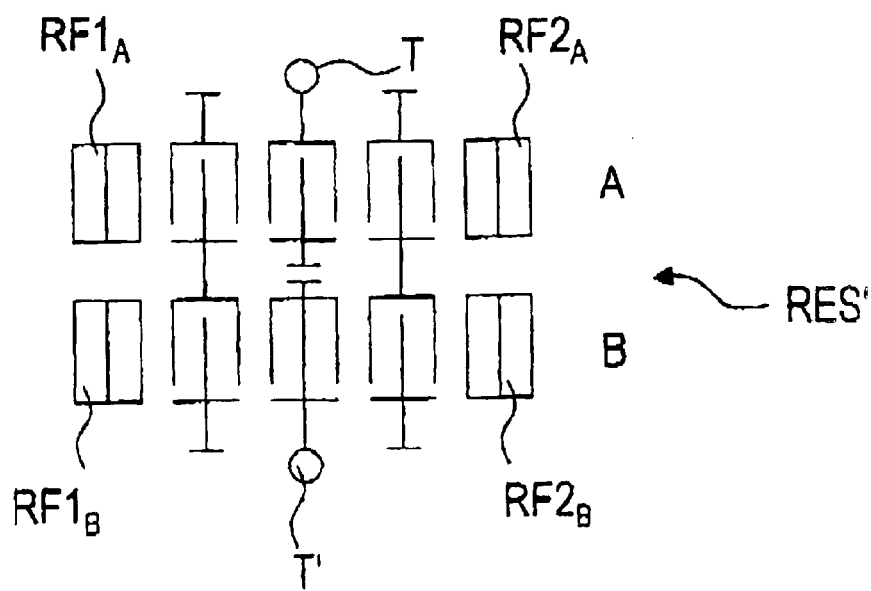
FIG. 3 is a schematic diagram showing an inventive, cascaded DMS filter.

FIG. 3 shows a cascaded two-track DMS filter in which two single-track DMS filters are connected to one another such that the outputs of the first track are connected to the inputs of the second track. This can be provided by two identical tracks in which both finger spacing (finger period) as well as plurality of fingers of the interdigital transducers IDT coincide. The aperture can also be identical. However, it is also possible that the first and second DMS filter in the cascaded track or the track A and the track B differ with respect to the finger period so that the resonant frequencies of first and second track are slightly shifted relative to one another.

Inventively, the reflectors RF1 and RF2 differ with respect to their reflectivity such that the minimums of the reflection functions of the first reflector RF1 and second reflector RF2 are shifted relative to one another. When the two tracks A and B are identical, then the reflectors $RF1_A$ and $RF1_B$ can also be identical. Given different tracks A and B, the reflectors of the two tracks also differ in a corresponding way, so that four different reflectors can be provided overall in the inventive two-track DMS filter; the minimums of their reflection functions can all be shifted relative to one another.

Figure 4:
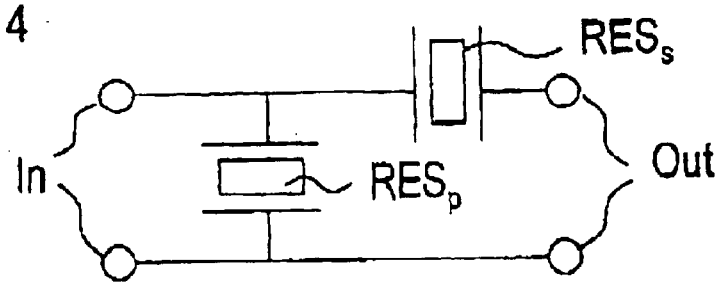
FIG. 4 is a schematic diagram showing an inventive resonator filter constructed of single-port resonators.

FIG. 4 shows a resonator filter in branching circuitry that is constructed of two single-port resonators (as shown in FIG. 1), here in its simplest embodiment as an L-element. This comprises a serial resonator $RES_S$ and a parallel resonator $RES_P$ that are connected in the illustrated way to the input In or to the output Out of the filter. A filter can also be composed of a plurality of series-connected L-elements of the same or different type.

Inventively, the reflectors of at least one resonator of this ladder-type filter differ with respect to their reflectivity, particularly the two reflectors of the parallel resonator $RES_P$. Since the two resonators $RES_S$ and $RES_P$ in such a ladder-type filter already differ from one another with respect to their finger period, all four reflectors present in the two resonators in the illustrated L-element can also comprise a different reflection function. The only thing significant for the invention, however, is that the reflectors within a resonator differ.

Figure 5:
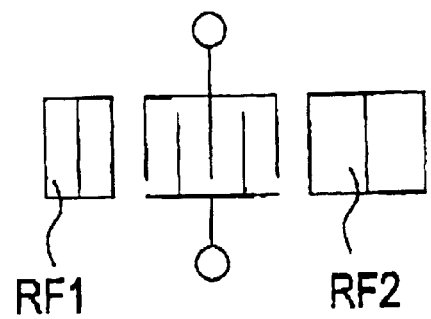

In the form of an exaggerated scale, FIG. 5 shows one possibility of designing the reflectors RF1 and RF2 of a resonator different. In FIG. 5, the second reflector RF2 has a larger finger period, i.e., a larger spacing of the centers of the stripes of the reflector stripes. The difference of the finger periods of the reflector stripes (i.e., center-to-center stripe spacings) in the resonators preferably lies in the region ≦5%. This means that the finger period of a reflector of a 1 GHZ resonator differs by a maximum of 5 MHz compared to the finger period of the second reflector in the same resonator.

The exact difference in the finger period, however, is dependent on the reflector itself, particularly on the plurality of reflector fingers that define the spacing of the pole locations in the reflection function and, thus, the spacings of the minimums in the reflection function. Preferably, the finger period differs such that the center frequency of the reflection function of both reflectors is shifted by half a pole location spacing relative to one another.

Figure 6:
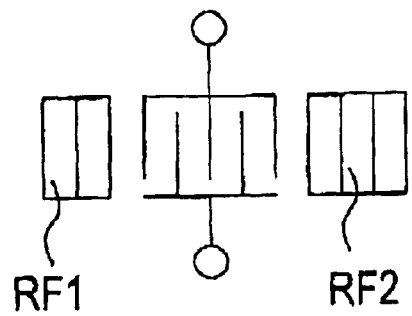

FIG. 6 shows a further possibility of generating a different reflection function or minimums shifted relative to one another in the two reflectors RF1 and RF2 of a resonator. The reflector RF2 has a greater plurality of reflector stripes than the reflector RF1. With respect to the exact plurality of reflector stripes, the two reflectors differ by 5 to 20%. It also applies here that, dependent on the total number, the difference in the plurality of reflector stripes is such that the minimums in the reflector function are optimally shifted relative to one another and respectively compensate with a maximum of the other reflector.

Figure 7:
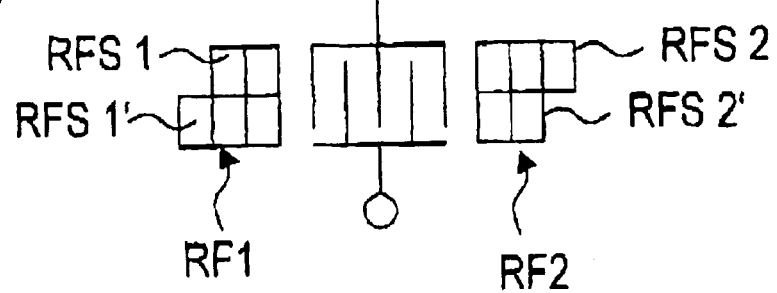

FIG. 7 shows a further possibility of inventively varying the reflectors of a resonator with respect to their reflection. The reflectors RF1 and RF2 are respectively divided into two segments parallel to one another, where the sum of the track widths of the segments yields the track width of the resonator. In this embodiment, the minimums of the reflection functions of individual reflector segments RFS are inventively shifted relative to one another such that they optimally compensate. Such a compensation can then ensue within the reflector segments RFS1 or RFS2 belonging to the same reflector RF1 or RF2, so that, for example, the overall reflector RF1 already comprises two reflection functions with minimums compensated relative to one another as a result of its different segments. However, it is also possible that the minimums of two segments in different reflectors compensate, for example, the minimums of the reflector segments RFS1 and RFS2 or RFS1' and RFS2'. In addition to the illustrated division into two segments, reflectors divided into three and more segments are also possible.

As particularly shown in FIG. 7, however, it is also possible that both the segments within a reflector as well as the reflector segments allocated to one another at both sides of the interdigital transducer differ. Given a division into respectively two segments, it is possible to select a total of two different reflection functions, particularly two different pluralities of reflector stripes per reflector segment RFS, as shown in FIG. 7. However, it is also possible to unite four different reflection functions or four different pluralities of reflector stripes and, thus, four different reflector segments in a single-port resonator.

FIG. 8 likewise shows reflectors RF1 and RF2 divided into segments that are parallel to one another. Differing from FIG. 7, different reflection functions are generated with different finger periods and different pluralities of reflector stripes in the reflector segments. Of course, it is also possible to employ only finger periods in the reflector segments.

On the basis of a comparison of FIGS. 9 and 10, the improvement in the filter properties achieved with the inventive resonator filters is explained below. FIG. 9 shows the transmission curve DK of a single-track DMS filter. The pass region in which the filter exhibits a low insertion attenuation can be seen well in FIG. 9. However, noise spikes are located to the left of the pass-band, these leading to a deteriorated attenuation in this frequency range and, thus, to a deteriorated adjacent channel selectivity. The reflection function of the identical reflectors employed in the known single-track DMS filter is shown as a further curve RK. It can be clearly seen that the reflection function to the left of the region of maximum reflection coinciding with the pass-band of the filter exhibits a number of spikes with deteriorated reflection that represent the minimums of the reflection function. It is clear in the comparative presentation that the minimums of the reflection coincide in terms of frequency with noise spikes in the transfer function DK since the noise spikes are caused by the minimums of the reflection function.

Figure 10:
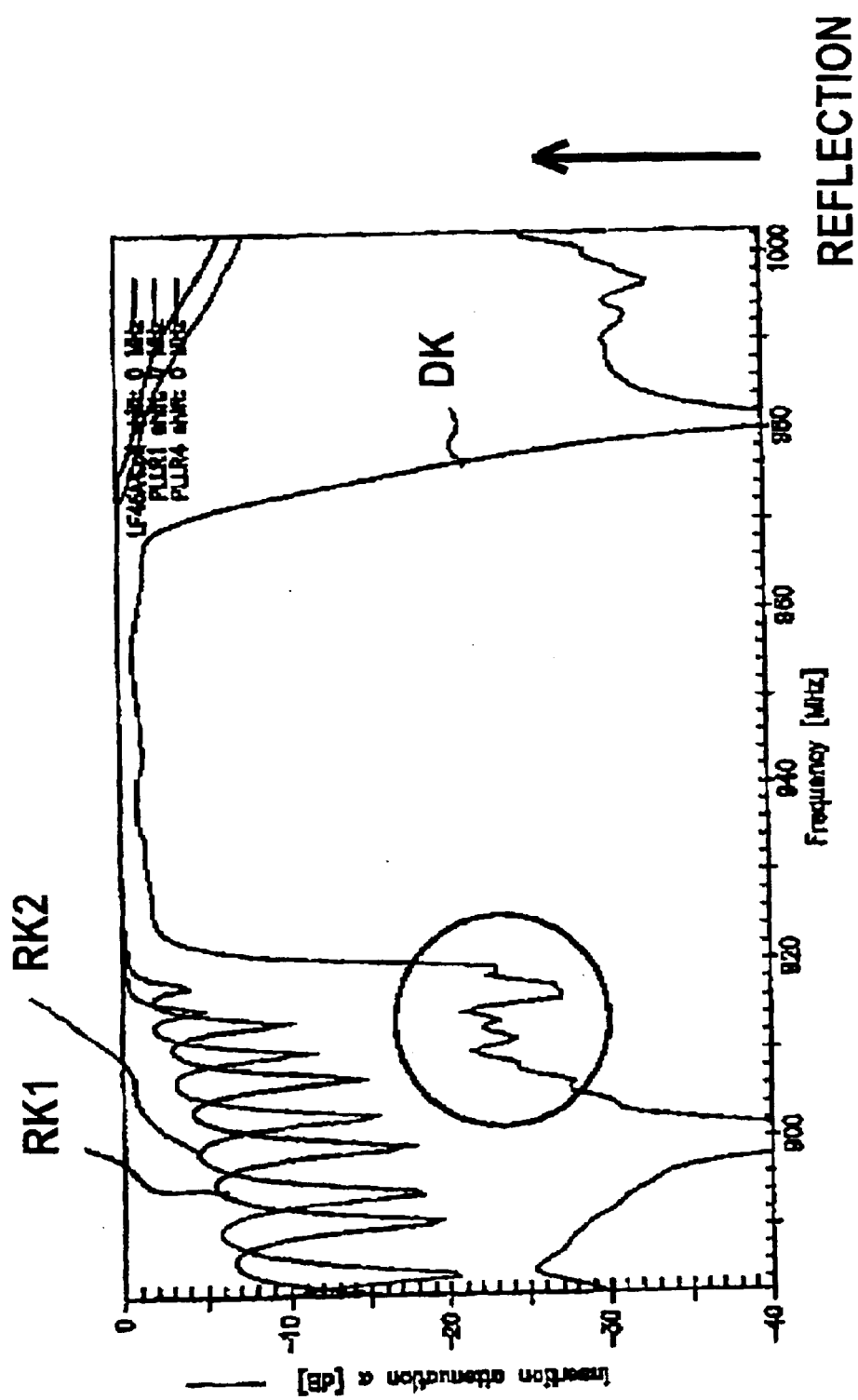
FIG. 10 is a graph showing an inventive single-track DMS filter compared to the reflection functions of the inventively varied reflectors.

FIG. 10 shows the transmission curve and the reflection functions of an inventive single-track DMS filter in which the two reflectors are varied and comprise different reflection functions. The minimums of the two reflection functions are shifted relative to one another, particularly by a pole location (i.e., half the spacing of the minimums) in the disturbing region of the noise spikes. As a result, a clear improvement in the region of the noise spikes, which are now clearly reduced in size, derives in the transmission curve DK of the inventive DMS filter. The filter therefore comprises an improved adjacent channel selectivity in the region of the noise spikes. A direct comparison of the two otherwise identical DMS filters of FIGS. 9 and 10 shows that the attenuation of the noise spikes is improved from 18 dB to approximately 22 dB. When such a filter is then utilized as an input filter (RX filter) in a communication system with frequency duplexing, then the noise spikes lie exactly in the region of the TX band for which the RX filter requires a suppression (selection) of at least 20 dB. As shown, this is possible with the invention, which enables the single-track DMS filter selected as an example with the desired selection of at least 20 dB.

Figure 11:
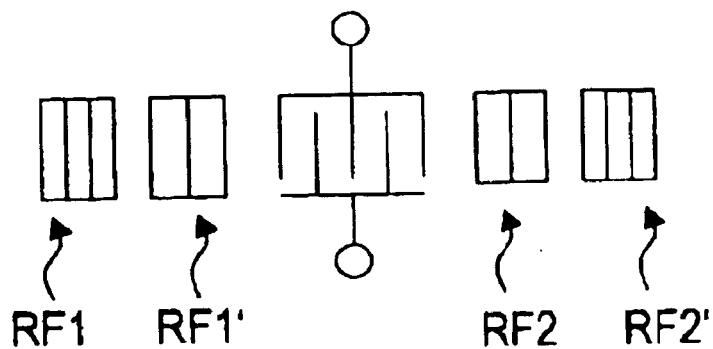
FIG. 11 is a schematic diagram showing a resonator filter with an interdigital transducer that is arranged between a first and a second reflector. Each reflector is divided into two sub-reflectors (serial segments) arranged next to one another. In this Figure, the sub-reflectors differ with regard to the separation of the reflector strip centers.
Figure 12:
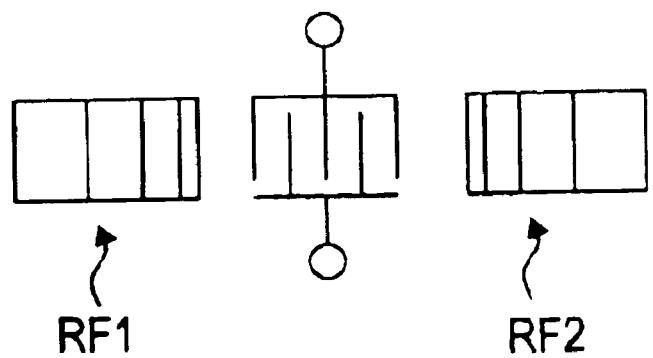
FIG. 12 is a schematic diagram showing a resonator filter with two reflectors in which the reflector strips exhibit continuously increasing separations.
Figure 13:
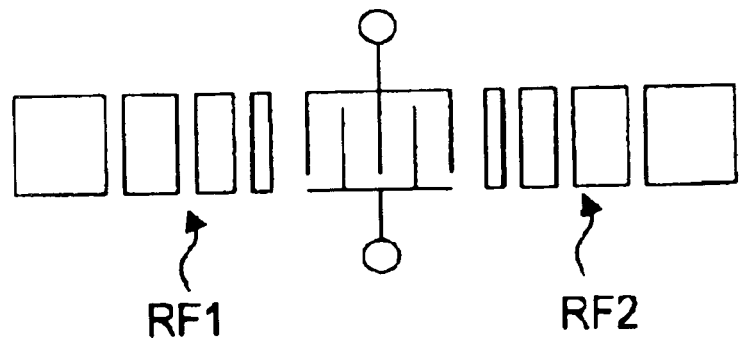
FIG. 13 is a schematic diagram showing a resonator filter with two reflectors in which the width of the reflector strips continuously increases in the resonators.
Figure 14:
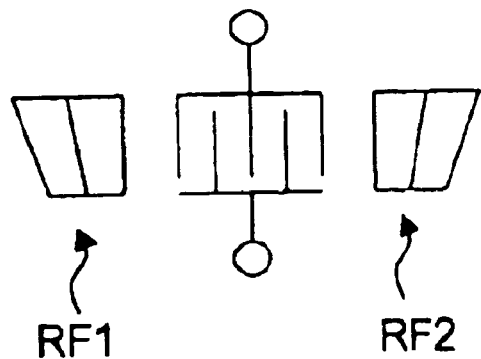
FIG. 14 is a schematic diagram showing a resonator filter with two reflectors, in which the separations of the reflector strips continuously increases transverse to the propagation direction of the surface wave.
Figure 15:
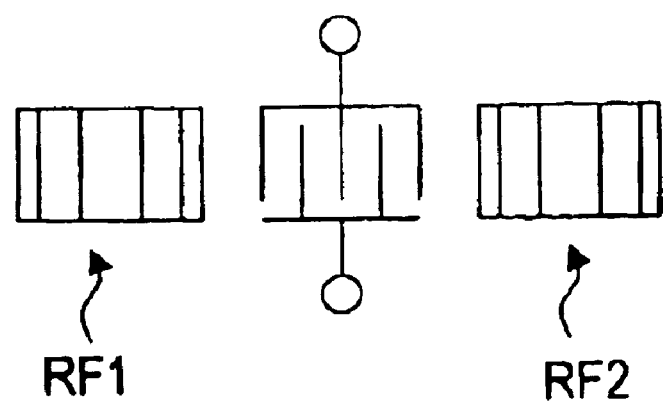
FIG. 15 is a schematic diagram showing a resonator filter with two reflectors, in which the separations of the reflector strips follow a continuous function viewed over the length of the reflectors. In the figure, this function exhibits a maximum in the center of the reflector, such that the reflector strip separation is largest in the middle of the reflectors.

FIGS. 11–15 illustrate embodiments of the invention as discussed in the preceding paragraphs. FIG. 11 shows a resonator filter with an interdigital transducer that is arranged between a first and a second reflector. Each reflector is divided into two sub-reflectors (serial segments) arranged next to one another. In the Figure, the sub-reflectors differ with regard to the separation of the reflector strip centers. FIG. 12 shows a resonator filter with two reflectors, in which the reflector strips exhibit continuously increasing separations. FIG. 13 shows a resonator filter with two reflectors, in which the width of the reflector strips continuously increases in the resonators. FIG. 14 shows a resonator filter with two reflectors, in which the separations of the reflector strips continuously increases transverse to the propagation direction of the surface wave. Finally, FIG. 15 shows a resonator filter with two reflectors, in which the separations of the reflector strips follow a continuous function viewed over the length of the reflectors. In the shown FIG. 15, this function exhibits a maximum in the center of the reflector, such that the reflector strip separation is largest in the middle of the reflectors. However, any other functions are also conceivable and the subject matter of the invention.

Up to now, the selection in known DMS filters was improved by cascading a plurality of tracks until a desired selection has been achieved. With the invention, it is now possible to adequately improve the selection using the variation of a single DMS track. Of course, the selection of multi-track DMS filters can also be improved with the invention.

Given single-port resonators or resonator filters manufactured thereof (for example, ladder-type filters), the selection of the filters is improved with the invention and steeper edges of the pass-band are enabled for the transmission curve.

For the sake of clarity, the invention was only presented exactly on the basis of a few exemplary embodiments but is not limited to these. In particular, the variations of resonators that have already been disclosed can also be transferred to inventive reflectors and resonator filters manufactured therewith.

Reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The particular implementations shown and described herein are illustrative examples of the invention and are not intended to otherwise limit the scope of the invention in any way. For the sake of brevity, conventional electronics, and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A resonator filter for acoustic surface waves or surface-proximate waves, comprising:

a whole positive number n of acoustic resonators fashioned on a piezoelectric substrate, each respectively comprising at least one interdigital transducer; and a first and a second reflector between which the at least one interdigital transducer is arranged, the reflectors being respectively allocated to at least one of the n resonators and that respectively are constructed to exhibit a frequency-dependent reflection behavior and to provide a reflection function comprising at least one minimum;

wherein the first and the second reflector are fashioned differently so that the frequency position of the minimums of the two reflection functions of the first and second reflector are shifted relative to one another; and wherein the minimums of the reflection functions of the first and second reflector are shifted relative to one another such that a minimum of the first reflection function has approximately the same frequency position as a maximum of the second reflection function.

2. The resonator filter according to claim 1, further comprising:

a first acoustic track and a second acoustic track, a first acoustic resonator being provided in the first acoustic track, and a second acoustic resonator being provided in the second acoustic track, the first resonator and the second resonator being connected to one another;

the first and second reflectors being arranged in a same track.

3. The resonator filter according to claim 1, wherein the resonator filter is fashioned as a single-track or multi-track dual-mode SAW (DMS) filter.

4. The resonator filter according to claim 1, wherein a spacing of respectively two neighboring centers of reflector strips varies over a length of the reflectors measured in a wave propagation direction.

5. The resonator filter according to claim 4, wherein specific values for the spacing of two neighboring reflector strip centers follow corresponding function values of a periodically sampled, steady function viewed over the length of the resonators.

6. The resonator filter according to claim 1, wherein a width of reflector strips varies over a length of the reflectors measured in a wave propagation direction.

7. The resonator filter according to claim 1, wherein, when comprising one-port resonators, an interdigital transducer is arranged at each one-port resonator between a first and a second reflector, and frequency positions of the minimums of the reflection functions of the first and second reflector are shifted relative to one another at at least one resonator.

8. The resonator filter according to claim 1, wherein at least one of the reflectors has reflector stripes and is divided into two or more segments that differ on the basis of at least one of a plurality and spacing of centers of the reflector stripes.

9. The resonator filter according to claim 8, wherein the segments of the at least one reflector are arranged parallel to one another and thus respectively form a sub-aperture of the resonator, the sum of the sub-aperture widths allocated to the segments corresponds to at least an overall aperture of the resonator.

10. The resonator filter according to claim 8, wherein the segments are arranged following one another in a wave propagation direction.

11. The resonator filter according to claim 1, wherein specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements follow corresponding function values of a steady function in the region of the transition as viewed over a length of the resonator, thereby avoiding discontinuities and hard transitions between neighboring resonator structure elements.

12. A resonator filter for acoustic surface waves or surface-proximate waves, comprising:

a whole positive number n of acoustic resonators fashioned on a piezoelectric substrate, each respectively comprising at least one interdigital transducer; and a first and a second reflector between which the at least one interdigital transducer is arranged, the reflectors being respectively allocated to at least one of the n resonators and that respectively are constructed to exhibit a frequency-dependent reflection behavior and to provide a reflection function comprising at least one minimum;

wherein the first and the second reflector are fashioned differently so that the frequency position of the minimums of the two reflection functions of the first and second reflector are shifted relative to one another;

wherein a width of reflector strips varies over a length of the reflectors measured in a wave propagation direction; and wherein specific values for the width of reflector strips follow corresponding function values of a periodically sampled, steady function viewed over the length of the resonators.

13. The resonator filter according to claim 12, further comprising:

a first acoustic track and a second acoustic track, a first acoustic resonator being provided in the first acoustic track, and a second acoustic resonator being provided in the second acoustic track, the first resonator and the second resonator being connected to one another;

the first and second reflectors being arranged in a same track.

14. The resonator filter according to claim 12, wherein the resonator filter is fashioned as a single-track or multi-track dual-wave SAW (DMS) filter.

15. The resonator filter according to claim 12, wherein specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements follow corresponding function values of a steady function in the region of the transition as viewed over a length of the resonator, thereby avoiding discontinuities and hard transitions between neighboring resonator structure elements.

16. A resonator filter for acoustic surface waves or surface-proximate waves, comprising:

a whole positive number n of acoustic resonators fashioned on a piezoelectric substrate, each respectively comprising at least one interdigital transducer; and a first and a second reflector between which the at least one interdigital transducer is arranged, the reflectors being respectively allocated to at least one of the n resonators and that respectively are constructed to exhibit a frequency-dependent reflection behavior and to provide a reflection function comprising at least one minimum;

wherein the first and the second reflector are fashioned differently so that the frequency position of the minimums of the two reflection functions of the first and second reflector are shifted relative to one another; and wherein at least one of a width of individual and a center-to-center spacing of two neighboring electrode fingers of at least one of the interdigital transducers and reflector stripes varies continuously transverse to a length of the resonator composed of interdigital transducers and reflectors.

17. The resonator filter according to claim 16, wherein the quantities of width and center-to-center spacing transverse to the length are fashioned in a linearly increasing manner.

18. The resonator filter according to claim 17, further comprising:

a first acoustic track and a second acoustic track, a first acoustic resonator being provided in the first acoustic track, and a second acoustic resonator being provided in the second acoustic track, the first resonator and the second resonator being connected to one another;

the first and second reflectors being arranged in a same track.

19. The resonator filter according to claim 17, wherein the resonator filter is fashioned as a single-track or multi-track dual-wave SAW (DMS) filter.

20. The resonator filter according to claim 17, wherein specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements follow corresponding function values of a steady function in the region of the transition as viewed over a length of the resonator, thereby avoiding discontinuities and hard transitions between neighboring resonator structure elements.

21. The resonator filter according to claim 16, wherein the resonator filter is fashioned as a single-track or multi-track dual-wave SAW (DMS) filter.

22. The resonator filter according to claim 16, further comprising:

a first acoustic track and a second acoustic track, a first acoustic resonator being provided in the first acoustic track, and a second acoustic resonator being provided in the second acoustic track, the first resonator and the second resonator being connected to one another;

the first and second reflectors being arranged in a same track.

23. The resonator filter according to claim 16, wherein specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements follow corresponding function values of a steady function in the region of the transition as viewed over a length of the resonator, thereby avoiding discontinuities and hard transitions between neighboring resonator structure elements.

24. A resonator filter for acoustic surface waves or surface-proximate waves, comprising:

a first reflector that is divided into two or more segments arranged parallel to a propagation direction of a surface wave;

a second reflector that is divided into two or more segments arranged parallel to a propagation direction of a surface wave; and an interdigital transducer arranged between the first reflector and the second reflector;

wherein a first acoustic sub-track is formed by two of the segments and the interdigital transducer lying between them, these two segments differing within a sub-track with regard to a separation of a middle of their reflector stripes;

wherein a second acoustic sub-track is formed by two of the segments and the interdigital transducer lying between them, these two segments differing within a sub-track with regard to a separation of a middle of their reflector stripes; and wherein the segments differ between the first acoustic sub-track and the second acoustic sub-track.

25. The resonator filter according to claim 24, further comprising:

a first acoustic track and a second acoustic track, a first acoustic resonator being provided in the first acoustic track, and a second acoustic resonator being provided in the second acoustic track, the first resonator and the second resonator being connected to one another;

the first and second reflectors being arranged in a same track.

26. The resonator filter according to claim 24, wherein the resonator filter is fashioned as a single-track or multi-track dual-wave SAW (DMS) filter.

27. The resonator filter according to claim 24, wherein specific values for a width of at least one of electrode fingers residing at an end and reflector stripes residing at at least one of the end and a center-to-center spacing of at least one of respectively two neighboring electrode fingers and reflector stripes in a region of the transition between two resonator structure elements follow corresponding function values of a steady function in the region of the transition as viewed over a length of the resonator, thereby avoiding discontinuities and hard transitions between neighboring resonator structure elements.

* * * * *